US010844473B2

(12) United States Patent
Fujii et al.

(10) Patent No.: US 10,844,473 B2
(45) Date of Patent: Nov. 24, 2020

(54) ARC EVAPORATION DEVICE

(71) Applicant: Kobe Steel, Ltd., Hyogo (JP)

(72) Inventors: Hirofumi Fujii, Takasago (JP); Hideaki Kamezawa, Tokyo (JP); Shinichi Tanifuji, Takasago (JP); Hideki Shirane, Takasago (JP)

(73) Assignee: Kobe Steel, Ltd., Hyogo (JP)

( * ) Notice: Subject to any disclaimer, the term of this patent is extended or adjusted under 35 U.S.C. 154(b) by 188 days.

(21) Appl. No.: 16/070,732

(22) PCT Filed: Jan. 6, 2017

(86) PCT No.: PCT/JP2017/000295
§ 371 (c)(1),
(2) Date: Jul. 17, 2018

(87) PCT Pub. No.: WO2017/130662
PCT Pub. Date: Aug. 3, 2017

(65) Prior Publication Data
US 2019/0024228 A1 Jan. 24, 2019

(30) Foreign Application Priority Data
Jan. 26, 2016 (JP) ................. 2016-012305

(51) Int. Cl.
*C23C 14/32* (2006.01)
*H01J 37/32* (2006.01)
(Continued)

(52) U.S. Cl.
CPC ........ *C23C 14/325* (2013.01); *C23C 14/0021* (2013.01); *C23C 14/246* (2013.01);
(Continued)

(58) Field of Classification Search
CPC .................................................. C23C 14/325
See application file for complete search history.

(56) References Cited

U.S. PATENT DOCUMENTS

2016/0060750 A1 3/2016 Ono et al.
2016/0326630 A1* 11/2016 Atsumi ................. C23C 14/54

FOREIGN PATENT DOCUMENTS

JP 06081147 A * 3/1994
JP 2007-070690 A 3/2007
(Continued)

OTHER PUBLICATIONS

Notification of Transmittal of Translation of the International Preliminary Report on Patentability (Chapter I) and Translation of Written Opinion of the International Searching Authority; PCT/JP2017/000295; dated Aug. 9, 2018.
(Continued)

*Primary Examiner* — John J Brayton
(74) *Attorney, Agent, or Firm* — Studebaker & Brackett PC

(57) ABSTRACT

An arc evaporation device includes a bar-shaped target having a front end surface and a side surface to be melted and evaporated from the front end surface by arc discharge; an arc power supply; a target feed unit which moves the target axially and in a feed direction; an ignition rod capable of contact with the side surface of the target, in an intersecting direction intersecting the feed direction; a rotary actuator which moves the ignition rod along the intersecting direction from a retraction position apart from the side surface in the intersecting direction to make the ignition rod enter a transport region into which the target is fed; and a detection unit which detects whether or not the ignition rod has come into contact with the side surface of the target during movement of the ignition rod.

9 Claims, 9 Drawing Sheets

(51) Int. Cl.
  *C23C 14/24* (2006.01)
  *C23C 14/00* (2006.01)
  *C23C 14/54* (2006.01)
  *C23C 14/34* (2006.01)
  *H01F 7/02* (2006.01)

(52) U.S. Cl.
  CPC .............. *C23C 14/34* (2013.01); *C23C 14/54* (2013.01); *H01F 7/0273* (2013.01); *H01J 37/32055* (2013.01); *H01J 37/32064* (2013.01); *H01J 37/3299* (2013.01); *H01J 37/32568* (2013.01); *H01J 37/32614* (2013.01)

(56) References Cited

FOREIGN PATENT DOCUMENTS

| | | |
|---|---|---|
| JP | 4827235 B2 | 11/2011 |
| WO | 2014/188634 A1 | 11/2014 |

OTHER PUBLICATIONS

The extended European search report issued by the European Patent Office dated Jul. 16, 2019, which corresponds to European Patent Application No. 17743896.7-1103 and is related to U.S. Appl. No. 16/070,732.

\* cited by examiner

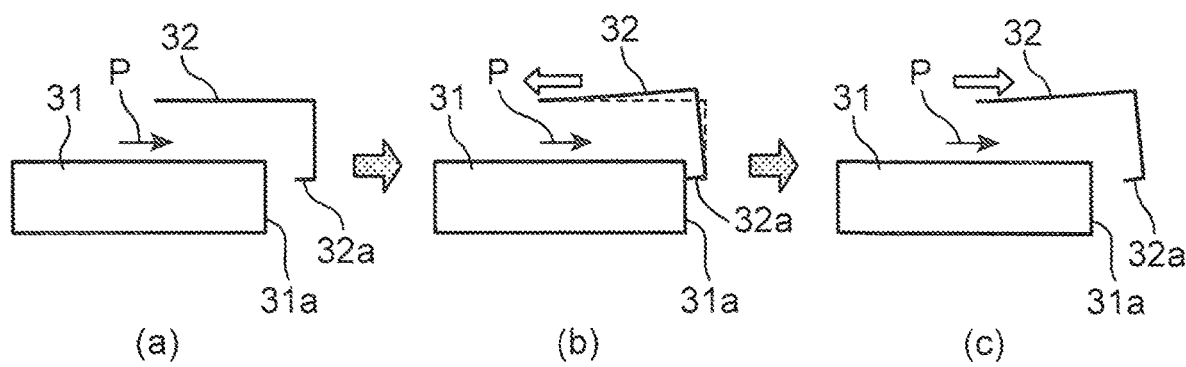

ARC EVAPORATION DEVICE

TECHNICAL FIELD

The present invention relates to an arc evaporation device having a bar-shaped target which is evaporated by arc discharge.

BACKGROUND ART

There have been conventionally proposed, as a method for forming a coating on a surface of a substrate of a tool, a machine part, or the like for the purpose of improving wear resistance or the like, various methods for forming a coating on a surface of a substrate using arc discharge. As a material of such a coating, there is sometimes used a bar-shaped target to establish continuous film-forming.

Patent Literature 1 discloses an arc evaporation source having a cathode 31 which is a bar-shaped target as shown in (a) of FIG. 9. In such an arc evaporation source, an evaporation face 31a as a front end surface of the cathode 31 is heated by arc discharge. The heating melts a material and cause it to adhere on a surface of a substrate, thus film-forming on the surface of the substrate being performed. The cathode 31, which is consumed from the evaporation face 31a as the front end thereof during such film-forming, is fed toward the evaporation face 31a (a feed direction P) by a feed mechanism not shown.

In the arc evaporation source disclosed in Patent Literature 1, the position of the evaporation face 31a is measured by use of a trigger 32 for ignition for arc discharge, in order to appropriately maintain a position of the evaporation face 31a of the cathode 31. The trigger 32 has an L-shaped curved main body and a front end portion 32a protruding beyond a front end of the main body toward the evaporation face 31a of the cathode 31 along an axial direction of the cathode 31. As shown in (b) of FIG. 9, performed are moving the trigger 32 in a direction opposite to the feed direction P of the cathode 31 to bring the front end portion 32a of the trigger 32 into contact with the evaporation face 31a of the cathode 31 and measuring a movement amount of the trigger 32 at the time of contact, to thereby measure the position of the evaporation face 31a.

In the above arc evaporation source, since the measurement of the position of the evaporation face 31a is performed by bringing the front end portion 32a of the trigger 32 into contact with the evaporation face 31a of cathode 31 along the axial direction of the cathode 31, the repeat thereof involves an axial deformation in the trigger 32 in the axial direction of the cathode 31 due to a reaction force applied by the cathode 31 whose evaporation face 31a contacts the trigger 32 as shown in (c) of FIG. 9. The deformation axially displaces the front end portion 32a of the trigger 32. The displacement hinders the position of the evaporation face 31a from being precisely measured through the contact of the front end portion 32a of the trigger 32 with the evaporation face 31a of the cathode 31.

CITATION LIST

Patent Literature

Patent Literature 1: Japanese Patent No. 4827235

SUMMARY OF INVENTION

An object of the present invention, which has been made in view of the above circumstances, is to provide an arc evaporation device capable of precisely detecting, for a long period of time, whether or not a target is present at a predetermined position.

The arc evaporation device of the present invention includes: a bar-shaped target which has a front end surface as one end surface in an axial direction and a side surface extending in the axial direction and being continuous with a peripheral edge of the front end surface, the target being configured to be melted and evaporated from the front end surface thereof by arc discharge; an electrode for discharging between the electrode and the front end surface of the target; an arc power supply which applies a voltage between the target and the electrode to cause arc discharge between the front end surface and the electrode; a target feed unit which moves the target in a feed direction in which the front end surface advances and along the axial direction; a contact unit having a shape capable of making contact with the side surface of the target, at a predetermined position with respect to the feed direction, in an intersecting direction intersecting the feed direction; a contact-unit driving unit which moves the contact unit along the intersecting direction from a retraction position apart from the side surface in the intersecting direction, so as to make the contact unit enter a transport region into which the target is fed; and a detection unit which detects whether or not the contact unit has come into contact with the side surface of the target during movement of the contact unit.

BRIEF DESCRIPTION OF DRAWINGS

FIG. 3A is a side view of the target, the ignition rod, and a rotary actuator; FIG. 3B is a view showing the target of FIG. 3A seen from the axial direction and a view showing a state of the ignition rod before deformation; and FIG. 3C is a view showing the target of FIG. 3A seen from the axial direction and a view showing a state of the ignition rod after being deformed to be curved in a direction orthogonal to the axial direction.

FIG. 9 is a view showing axial deformation in an L-shaped trigger which has been brought into contact with the evaporation face of a front end of a cathode in a conventional arc evaporation source.

DESCRIPTION OF EMBODIMENTS

There will be below described about an embodiment of an arc evaporation device according to the present invention in further detail with reference to the drawings.

Figure 1:
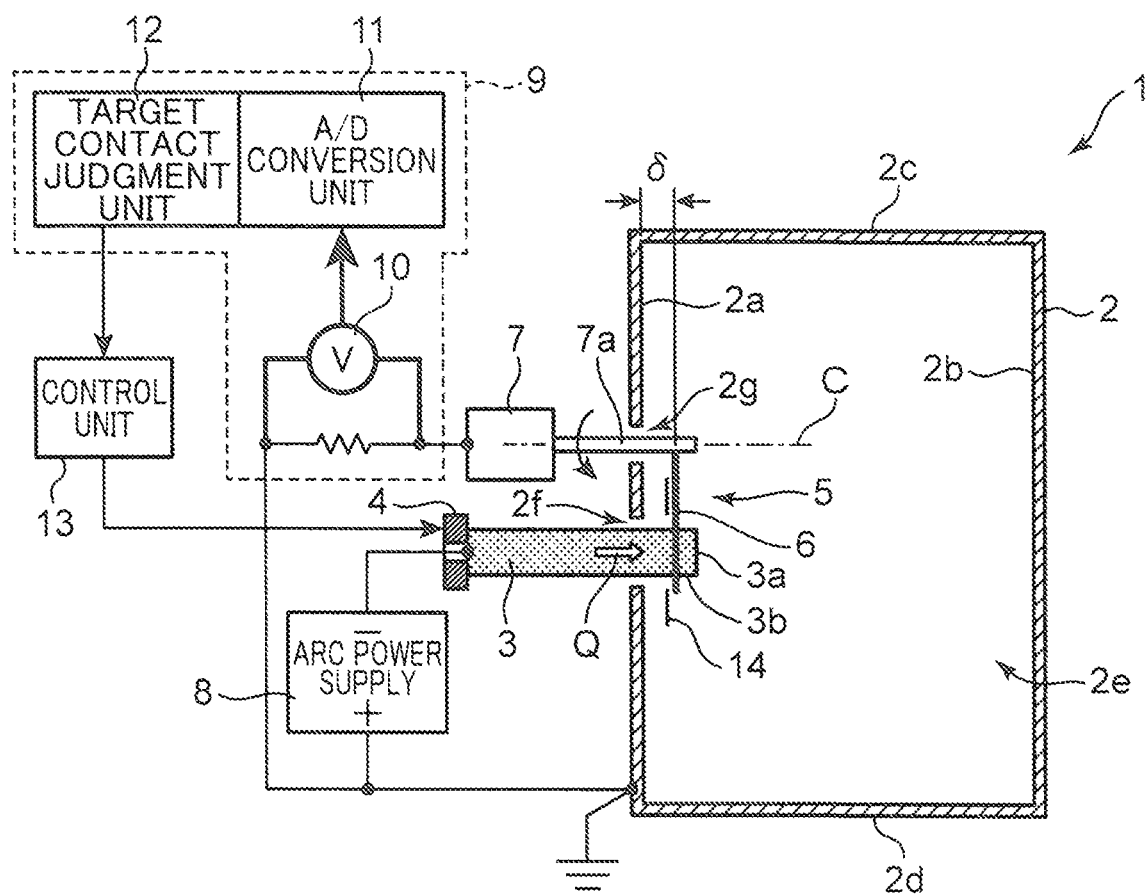
FIG. 1 is a view of an overall configuration of an arc evaporation device according to an embodiment of the present invention.
Figure 2:
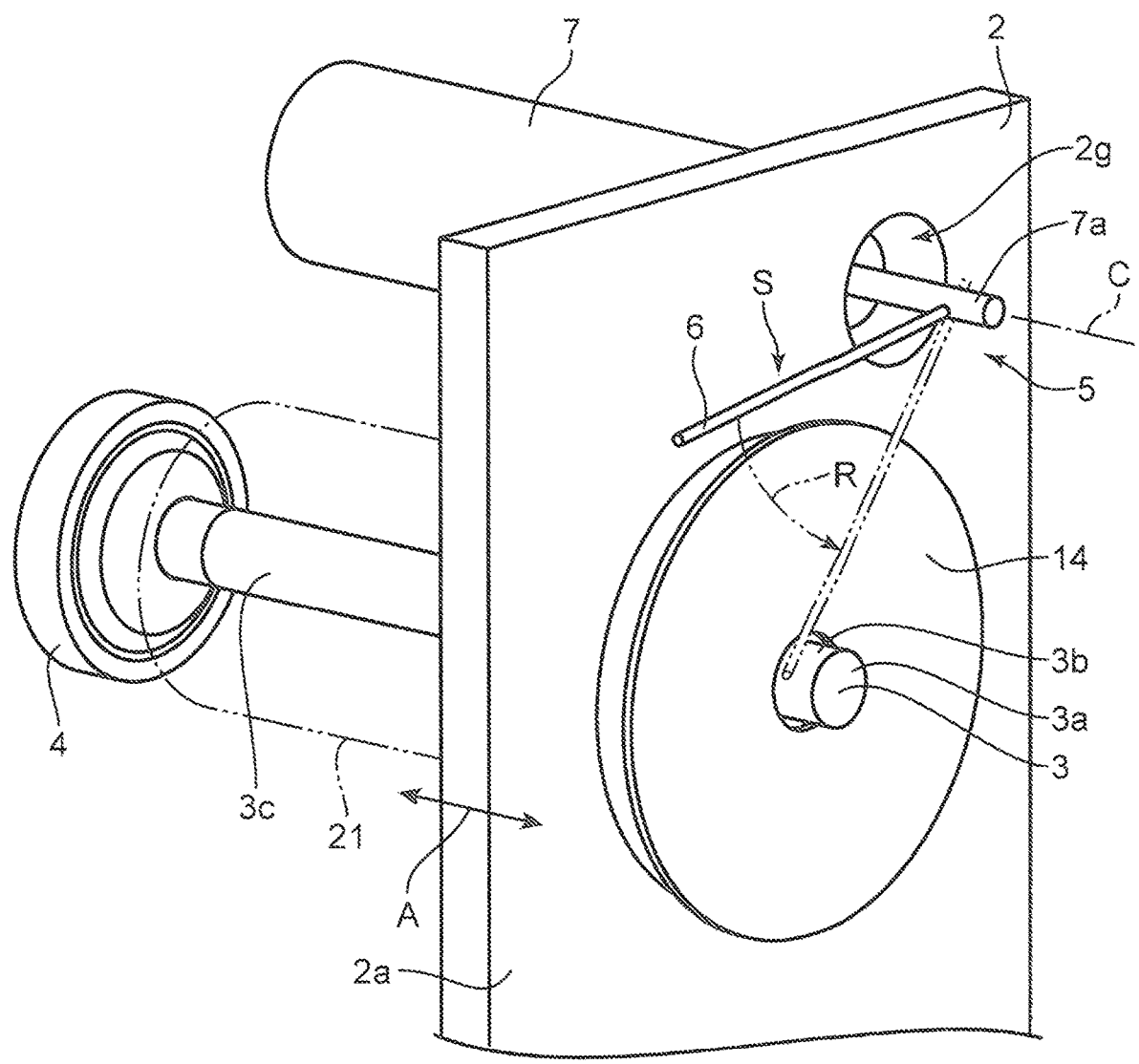
FIG. 2 is an enlarged perspective view of a surrounding part of a target shown in FIG. 1.

As shown in FIGS. 1 and 2, an arc evaporation device 1 of the present embodiment has a configuration for melting, inside a chamber 2, a bar-shaped target 3 to evaporate it from a front end surface 3a through arc discharge and forming a film on a substrate (not shown) housed in the chamber 2 by a substance generated by the evaporation, for example, a configuration for performing a film-forming technique such as sputtering or AIP. Specifically, the arc evaporation device 1 includes the chamber 2, the bar-shaped target 3, a target feed unit 4 which feeds the target 3 in an axial direction A of the target 3, an ignition mechanism 5 which causes arc discharge of the target 3 to start, an arc power supply 8, a detection unit 9, and a control unit 13 which controls the target feed unit 4 and the like. The ignition mechanism 5 has an ignition rod 6 which comes into contact with a side surface 3b of the target 3 to cause an arc on the target 3, and a rotary actuator 7 which rotates the ignition rod 6. The detection unit 9 detects whether or not the ignition rod 6 has come into contact with the side surface 3b of the target 3. The specific configuration of the detection unit 9 will be detailed later.

The arc evaporation device 1 shown in FIGS. 1 and 2 further includes a shield plate 14 which covers the periphery of the target 3 in proximity to the front end surface 3a of the target 3 inside the chamber 2 in order to prevent arc discharge from occurring on the side surface 3b to make arc discharge be caused only on the front end surface 3a of the target 3.

The chamber 2, which is a sealed casing made of a conductive material, functions as an electrode for discharging between the electrode and the front end surface 3a of the target 3. Specifically, the chamber 2 has a main wall 2a standing vertically, an opposition wall 2b opposed to the front end surface 3a of the target 3 at a position apart from the main wall 2a in the axial direction A, a top plate 2c, and a bottom plate 2d. The main wall 2a, the opposition wall 2b, the top plate 2c, and the bottom plate 2d form a space portion 2e for housing the ignition rod 6 and a portion of the target 3, the portion including the front end surface 3a. The space portion 2e is decompressed to a vacuum or a pressure close thereto during generation of arc discharge (i.e. during film-forming) by a not-graphically-shown vacuum pump.

The main wall 2a has a through hole 2f and a through hole 2g. The through hole 2f has an inner diameter which allows the target 3 to be inserted thereinto. The through hole 2g has an inner diameter which allows a drive shaft 7a of the rotary actuator 7 of the ignition mechanism 5 to be inserted thereinto.

The target 3 has a bar-shape extending in the axial direction A, for example, a columnar shape. The target 3 has the circular front end surface 3a, which is one end surface in the axial direction A, and the side surface 3b extending in the axial direction A and being continuous from a peripheral edge of the front end surface 3a. The bar-shaped target 3 is configured to be melted and evaporated from the front end surface 3a by arc discharge.

The material of the target 3 is not particularly limited in the present invention but permitted to be any material capable of being evaporated by arc discharge and used as a material for film-forming. The target 3 can be made of a material such as carbon, tungsten carbide, tungsten, molybdenum, or niobium.

The bar-shaped target 3 has a front end portion, which penetrates the main wall 2a through the through hole 2f of the main wall 2a to be exposed to the inside of the space portion 2e of the chamber 2. The front end portion of the target 3 also penetrates the shield plate 14 to be positioned frontward of the shield plate 14 in a feed direction Q of the target 3. The front end surface 3a of the target 3 is opposed to the opposition wall 2b of the chamber 2. A remainder portion 3c of the target 3 is housed in a cylinder portion 21 provided on a back-surface side of the main wall 2a, outside of the chamber 2.

The target feed unit 4 has a configuration for linearly moving the target 3 in the feed direction Q in which the front end surface 3a advances and along the axial direction A of the target 3, being configured, for example, with a mechanism such as a ball screw. Although the target 3 is disposed so as to extend horizontally and the target feed unit 4 feeds the target 3 horizontally in the present embodiment, the present invention is not limited thereto. For example, in the case where the target 3 is disposed so as to extend vertically, the target feed unit 4 may feed the target 3 vertically along the axial direction thereof.

The ignition rod 6, which is one component of the above ignition mechanism 5, corresponds to a contact unit according to the present invention, having a shape capable of making contact with the side surface 3b of the target 3, at a predetermined position in the feed direction Q of the target 3, in a rotation direction R in which the ignition rod 6 is rotated around a center axis C extending in parallel to the feed direction Q in the present embodiment, the rotation direction R corresponding to an intersecting direction which intersects the feed direction Q. The ignition rod 6 has conductivity. The ignition rod 6 is configured with, for example, a bar-shaped member made of conductive metal material.

The ignition rod 6 is housed in the space portion 2e of the chamber 2 and disposed apart from the main wall 2a. Specifically, the ignition rod 6 is disposed at a position apart from the main wall 2a inside the chamber 2 by such a distance as to prevent arc discharge between the main wall 2a and the side surface 3b of the target 3, the position allowing the ignition rod 6 to enter a transport region T into which the target 3 is fed along the rotation direction R (i.e., a transport region T enclosed with the side surface 3b in FIG. 3B), from a retraction position S (see FIG. 3B) apart from the side surface 3b in the rotation direction R, along with the rotation direction R. This configuration, where the ignition rod 6 makes contact with the side surface 3b of the target 3 at a position apart from the main wall 2a of the chamber 2 by such a distance δ as to prevent arc discharge between the main wall 2a and the side surface 3b of the target 3, can prevent abnormal discharge such as arc discharge from being generated between the side surface 3b of the target 3 and the main wall 2a even when arc discharge is generated between the front end surface 3a of the target 3 and a part of the chamber 2 other than the main wall 2a (e. g., the top 2c, the bottom 2d, or the like). Since the above distance δ between the ignition rod 6 and the main wall 2a can prevent abnormal discharge, the shield plate 14 does not have to be interposed between the ignition rod 6 and the main wall 2a.

The rotary actuator 7, which is other component of the above ignition mechanism 5, corresponds to a contact-unit driving unit according to the present invention, being configured to move the ignition rod 6 from the above retraction position S along the rotation direction R so as to make the ignition rod 6 enter the transport region T into which the above target 3 is fed.

Specifically, the rotary actuator 7 has the drive shaft 7a which rotates around the center axis C extending in parallel with the axial direction A, the drive shaft 7a being apart from the side surface 3b of the target 3 in the rotation direction R. The drive shaft 7a protrudes into the space portion 2a of the chamber 2 through the through hole 2g of the main wall 2a of the chamber 2. A space between the drive shaft 7a and an inner wall of the through hole 2g is closed by an existing seal member (not shown) for a rotation shaft. The bar-shaped ignition rod 6 is fixed to the drive shaft 7a so as to protrude beyond a circumferential surface of the drive shaft 7a in a direction orthogonal to the axial direction of the drive shaft 7a.

The rotary actuator 7 rotates the ignition rod 6 by a drive force having a magnitude allowing the driving force to be balanced with a reaction force applied to the ignition rod 6 by the side surface 3b, when the ignition rod 6 comes into contact with the side surface 3b, to thereby make the ignition rod 6 stand still. The rotary actuator 7 has a mechanism to rotate the drive shaft 7a by, for example, air pressure. The rotary actuator 7 may be configured to rotate the drive shaft 7a by other mechanism such as a stepper motor to rotate the ignition rod 6.

Rotating the ignition rod 6 around the center axis C by the rotation of the drive shaft 7a, the rotary actuator 7 can rotate the ignition rod 6 so as to make the ignition rod 6 enter the transport region T from the retraction position S along the rotation direction R.

In the present embodiment, the drive shaft 7a of the rotary actuator 7 is inserted into the space portion 2e of the chamber 2 through the through hole 2g of the main wall 2a of the chamber 2, and coupled to the ignition rod 6 inside the space portion 2e. A gap between the drive shaft 7a and the inner wall of the through hole 2g is closed by an existing seal member (not shown) for sealing a rotation shaft so as to keep the drive shaft 7a rotatable. This configuration provides more excellent airtightness than a configuration including a rod penetrating a wall of the chamber 2 and being configured to move linearly to move the ignition rod 6, the penetrating part being sealed by a seal member such as a packing.

The rotary actuator 7 is controlled by the control unit 13 or the like so as to, for example, rotate the ignition rod 6 by such an angle as to allow the ignition rod 6 to enter the transport region T and after a lapse of a predetermined time, rotate the ignition rod 6 in a reverse direction to return to the retraction position S.

The arc power supply 8 applies a voltage between the target 3 and the chamber 2 as an electrode opposed to the target 3, thereby generating arc discharge between the front end surface 3a of the target 3 and the chamber 2. The arc power supply 8 includes a negative electrode connected to the target 3 and a positive electrode connected to the chamber 2 and also connected to the ignition rod 6 via the rotary actuator 7. This allows the arc power supply 8 to apply a voltage between the target 3 and the chamber 2 and also apply a voltage between the target 3 and the ignition rod 6. Bringing the ignition rod 6 into contact with the side surface 3b of the target with a voltage applied between the ignition rod 6 and the target 3 enables arc discharge to be started between the front end surface 3a and the chamber 2 (e.g., the top plate 2c and the bottom plate 2d).

The detection unit 9 detects whether or not the ignition rod 6 has come into contact with the side surface 3b of the target 3 during movement of the ignition rod 6. The detection unit 9 according to the present embodiment has a configuration for detecting, through an electric potential of the ignition rod 6, whether or not the ignition rod 6 has come into contact with the side surface 3b of the target 3. Specifically, the detection unit 9 has a potential measurement unit 10 which measures an electric potential of the ignition rod 6, a signal conversion unit 11, and a target contact judgment unit 12. The signal conversion unit 11 is, for example, an A/D conversion unit 11 shown in FIG. 1, which converts an analog signal obtained from the potential measurement unit 10 into a digital signal (i.e., A/D conversion).

The target contact judgment unit 12 judges whether or not contact between the ignition rod 6 and the target 3 is present by use of the digital signal converted by the signal conversion unit 11. Specifically, the target contact judgment unit 12 judges whether or not the ignition rod 6 has come into contact with the side surface 3b of the target 3 during movement of the ignition rod 6 along the rotation direction R to enter the transport region T from the retraction position S, based on whether or not the electric potential of the ignition rod 6 measured by the potential measurement unit 10 is equal to or lower than a predetermined potential.

When the detection unit 9 detects that the ignition rod 6 fails to come into contact with the side surface 3b of the target 3 during movement of the ignition rod 6 from the retraction position S to the transport region T, the control unit 13 controls the target feed unit 4 to move the target 3 in the feed direction Q in which the front end surface 3a advances and along the axial direction A. The control unit 13 also controls other components of the arc evaporation device 1, such as the rotary actuator 7.

The shield plate 14 is a plate-shaped member, having a through hole into which the target 3 can be inserted. The shield plate 14 is disposed in the chamber 2 while being insulated from the chamber 2. The shield plate 14, covering the periphery of the front end surface 3a of the target 3, is able to prevent arc discharge from occurring on the side surface 3b so as to make arc discharge occur only on the front end surface 3a of the target 3.

Figure 4:
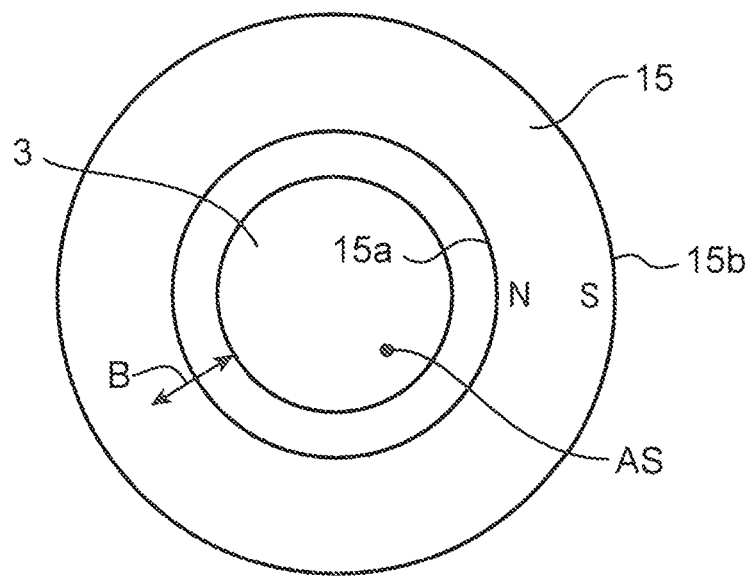
FIG. 4 is a view of a configuration in which ring-shaped magnets are arranged around a target as a modification of the present invention, the view being seen from a front end surface of the target.
Figure 5:
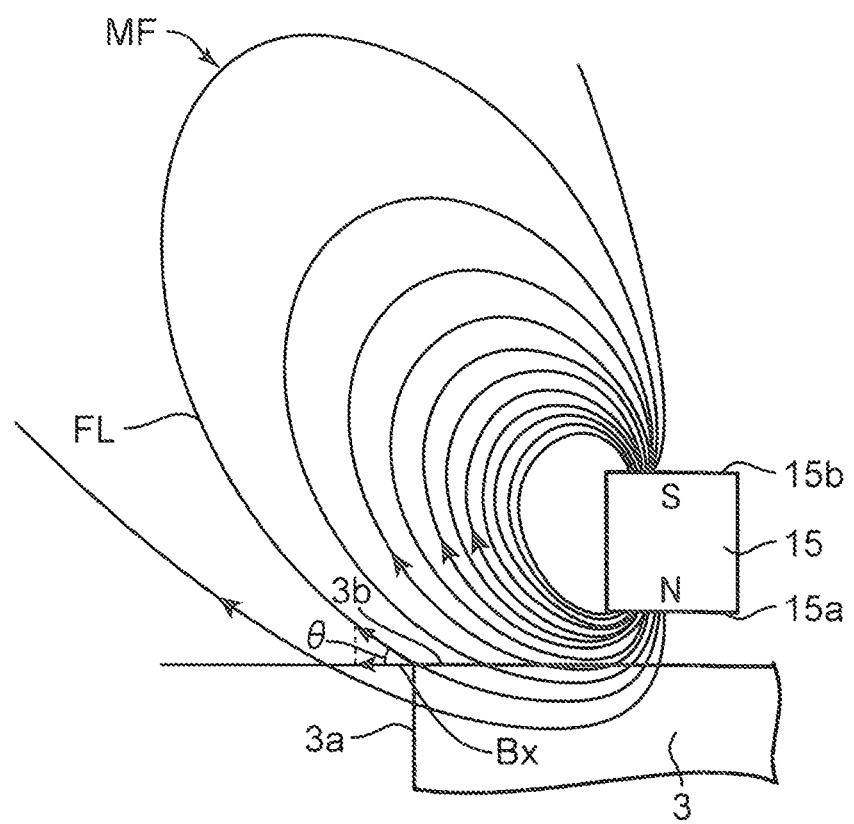
FIG. 5 is a view showing a magnetic field generated by the magnet in FIG. 4, which is an enlarged view of a part between the front end surface of the target and the magnet.

As a modification of the present invention shown in FIGS. 4 and 5, a ring-shaped magnet 15 may be disposed in the periphery of the target 3 in order to prevent arc discharge from occurring on the side surface 3b so as to make arc discharge occur only on the front end surface 3a of the target 3. The ring-shaped magnet 15 generates a magnetic field MF (see FIG. 5) to confine an arc spot AS (see FIG. 4) as a start point of arc discharge within the front end surface 3a of the target 3. The ring-shaped magnet 15 has magnetic poles 15a and 15b having different polarities from each other in an inner circumferential surface and an outer circumferential surface, respectively. The ring-shaped magnet 15 is disposed, for example, at a position apart from the main wall 2a in the feed direction Q inside the chamber 2 of FIG. 1. Specifically, as shown in FIGS. 4 and 5, the ring-shaped magnet 15 is disposed at a position apart from the side surface 3b of the target 3 in a radial direction B of the target 3 so as to enclose the target 3. These magnetic poles 15a and 15b are aligned in the radial direction B of the target 3. The ring-shaped magnet 15 is disposed, as shown in FIG. 5, on a rear side of the front end surface 3a of the target 3 in the axial direction A of the target 3, at such a position that the ring-shaped magnet 15 generates the magnetic field MF having a line of magnetic force FL which forms an angle θ being an acute angle (45° or less) between the side surface 3b of the target 3 and the line of magnetic force FL in a region closer to the front end surface 3a of the target 3 than the magnet 15. The magnetic pole 15a that is opposed to the side surface 3b of the target 3 is the N-pole and the magnetic pole 15b that faces the outside of the target 3 in the radial direction B is the S-pole.

The ring-shaped magnet 15 enclosing the target 3 allows the magnetic field MF, which is generated by the ring-shaped magnet 15, to be distributed uniformly on the side surface 3b of the target 3 in a circumferential direction of the target 3.

The ring-shaped magnet 15, disposed between the shield plate 14 and the main wall 2a of the chamber 2 shown in FIG. 1, can be protected from arc discharge generated on the front end surface 3a of the target 3 by the shield plate 14.

The ring-shaped magnet 15 is made of a permanent magnet which generates a strong magnetic force, manufactured of, for example, an alloy (e.g., NdFeB etc.) including neodymium. A permanent magnet generating a strong magnetic force can be manufactured also of an alloy including samarium and cobalt (SmCo). The magnet 15 may be an electromagnet.

The line of magnetic force FL of the magnetic field MF generated by the above magnet 15 goes out from the magnetic pole 15a opposed to the side surface 3b of the target 3 and, in a part in proximity to the front end surface 3a in the side surface 3b of the target 3, extends at an acute angle to the side surface 3b of the target 3. Therefore, even when the arc spot AS (see FIG. 4) as a point where arc discharge occurs on the surface of the target 3 intends to get out of the range of the front end surface 3a of the target 3 the line of magnetic force FL (see FIG. 5) on the side surface 3b acts on the arc spot S, on the side surface 3b in proximity to the front end surface 3a of the target 3, to push the arc spot S back into the region of the front end surface 3a. The arc spot AS is thereby maintained within the region of the front end surface 3a of the target 3 made of carbon, being prevented from going out from the range of the front end surface 3a of the target 3.

The magnet 15 may be disposed so as to align respective polarities different from each other of the magnetic pole 15a (e.g., the N-pole) and the magnetic pole 15b (e.g., the S-pole) in the axial direction A of the target 3. As described above, the magnet 15 is not limited to such a ring-shaped magnet as described above. It is also permissible to space a plurality of permanent magnets circumferentially of the target in the periphery of the target 3.

The magnet 15 is not an essential component in the arc evaporation device 1 of the present invention.

In the arc evaporation device 1 thus configured, evaporation of the target 3 is conducted as follows.

First, in advance of conducting arc discharge, the target feed unit 4 advances the target 3 in the feed direction Q to send the target 3 to the space portion 2e of the chamber 2 until the front end surface 3a reaches a position frontward of the ignition rod 6 in the feed direction Q as shown in FIGS. 1 and 2.

Next, in a state where the ignition rod 6 of the ignition mechanism 5 is at the retraction position S (see FIG. 3B) apart from the target 3, the arc power supply 8 applies a voltage between the target 3 and the chamber 2 and applies a voltage between the target 3 and the ignition rod 6.

Figure 3A:
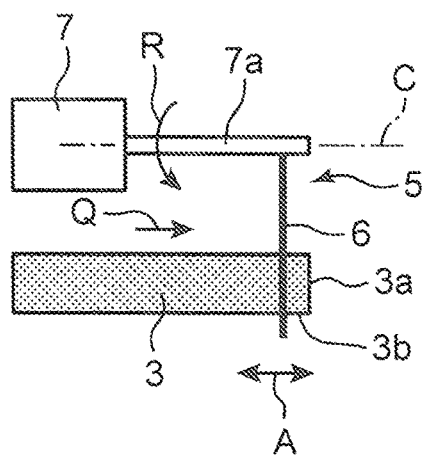
FIGS. 3A to 3C is a view for explaining a state where an ignition rod in FIG. 1 is in contact with the target.
Figure 3B:
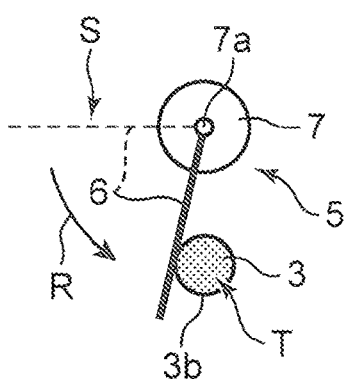

The rotary actuator 7 of the ignition mechanism 5 thereafter rotates the ignition rod 6 in the rotation direction R (see FIGS. 3A and 3B) to make the ignition rod 6 enter the transport region T of the target 3 (see FIG. 3B). When the ignition rod 6 comes into contact with the side surface 3b of the target 3, current passes between the target 3 and the ignition rod 6 to cause arc on the surface of the target 3, thereby generating arc discharge between the front end surface 3a of the target 3 and the chamber 2 (e.g., the top 2c and the bottom 2d). By thus bringing the ignition rod 6 applied with the voltage into contact with the side surface 3b of the target 3 in the state where the arc power supply 8 applies a voltage between the target 3 and the chamber 2 to cause arc on the target 3 arc discharge between the front end surface 3a of the target 3, the chamber 2 can be started. After a lapse of a predetermined time, the rotary actuator 7 rotates the ignition rod 6 in a direction reverse to the rotation direction R to return the ignition rod 6 to the retraction position S.

While arc discharge is occurring, the target 3 is melted and evaporated from the front end surface 3a thereof by arc discharge.

The target feed unit 4 periodically and automatically feeds the target 3 in the feed direction Q in a predetermined feed amount, thereby allowing the target 3 to be evaporated continuously.

There can be a case where the consumption of the target 3 exceeds an assumed consumption, under some evaporation condition of the target 3 (e.g., quality of a material of the target 3, or the like). Hence, in the above target evaporation device 1, the rotary actuator 7 periodically rotates the ignition rod 6 toward the target 3 in parallel with the periodical feed of the target 3 by the target feed unit 4, and the detection unit 9 periodically detects whether or not the target 3 is at a predetermined position.

Specifically, the rotary actuator 7 first periodically rotates the ignition rod 6 around the center axis C through rotation of the drive shaft 7a, thereby rotating the ignition rod 6 from the retraction position S along the rotation direction R to make the ignition rod 6 enter the transport region T (see FIG. 3B) into which the target 3 is fed.

At this time, in the detection unit 9, the potential measurement unit 10 measures an electric potential of the ignition rod 6 during movement of the ignition rod 6 from the retraction position S to the transport region T, and the signal conversion unit 11 converts the analog signal given from the potential measurement unit 10 to a digital signal. Using the converted digital signal, the target contact judgment unit 12 checks whether or not the electric potential of the ignition rod 6 measured by the potential measurement unit 10 is equal to or lower than a predetermined potential while the ignition rod 6 is moving to enter the transport region T from the retraction position S along the rotation direction R. On the basis of the variation in the potential, the target contact judgment unit 12 judges whether or not the ignition rod 6 has come into contact with the side surface 3b of the target 3. Specifically, the target contact judgment unit 12 judges the presence of the above contact when the electric potential of the ignition rod 6 is equal to or lower than a predetermined potential while judges absence thereof when the electric potential is higher than the predetermined potential.

When detecting the absence of contact of the ignition rod 6 with the side surface 3b of the target 3 during movement of the ignition rod 6 from the retraction position S to the transport region T, the detection unit 9 transmits a signal with respect to the detection result of absence of-contact to the control unit 13. Having received the detection result of absence of-contact from the detection unit 9, the control unit 13 controls the target feed unit 4 to move the target 3 in the feed direction Q (i.e., in a direction in which the front end surface 3a advances and along the axial direction A) by a predetermined additional feed amount.

According to this configuration, when the ignition rod 6 has failed to come into contact with the side surface 3b of the target 3 during movement of the ignition rod 6 from the retraction position S to the transport region T, the control unit 13 controls the target feed unit 4 to advance the target 3 in the feed direction Q in which the front end surface 3a advances and along the axial direction A. This allows automatic feed of the target 3 to be performed. As a result, when the consumption of the target 3 during film-forming work has brought the front end surface 3a of the target 3 to a position retracted from the ignition rod 6, the target 3 can be automatically fed with no interruption of the film-forming work.

Although the above target feed unit 4 conducts, as feed of the target 3, both of two types of feed, namely, periodical feed in a predetermined feed amount and additional feed when the ignition rod 6 has failed to come into contact with the side surface 3b of the target 3, it is also permitted to conduct only the latter feed. If the frequency of rotation of the ignition rod 6 by the rotary actuator 7 is increased, it is possible to automatically feed of the target 3 without interrupting the film-forming work by feed of the target 3 by the target feed unit 4 alone when the ignition rod 6 has failed to come into contact with the side surface 3b of the target 3.

Figure 3C:
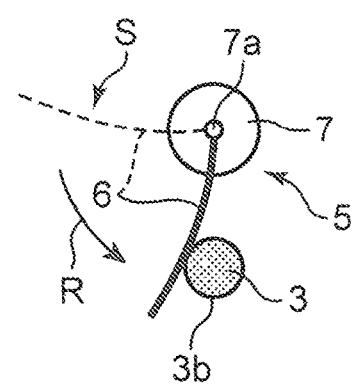

As described in the foregoing, the arc evaporation device 1 of the present embodiment is capable of detecting whether or not the ignition rod 6 has come into contact with the side surface 3b of the target 3 during movement of the ignition rod 6 from the retraction position S to the transport region T into which the target 3 is fed, in order to confirm the presence of the target 3. According to this configuration, even when repeat of contact of the ignition rod 6 with the target 3 for detecting the target 3 deforms the ignition rod 6 in the rotation direction R intersecting the feed direction Q of the target 3 as shown in FIG. 3C, the detection unit 9 can detect whether or not the ignition rod 6 has come into contact with the side surface 3b of the target 3 at a predetermined position in the feed direction Q of the target 3 during movement of the ignition rod 6 along the rotation direction R from the retraction position S toward the transport region T into which the target 3 is fed. By use of this detection result, can be performed the judgment whether or not the target 3 is present at a predetermined position in the feed direction Q of the target 3 (i.e., whether the front end of the target 3 protrudes frontward of the ignition rod 6 in the feed direction Q or not). This makes it possible to precisely detect, for a long period of time, whether or not the target 3 is present at a predetermined position.

Upon contact of the ignition rod 6 with the side surface 3b of the target 3 while a voltage is being applied between the target 3 and the ignition rod 6 as described above to cause arc on the target 3, current passes between the ignition rod 6 and the target 3, involving a phenomenon of potential reduction in the ignition rod 6. By use of this potential variation, the above configuration enables the target contact judgment unit 12 to judge whether or not the ignition rod 6 has come into contact with the side surface 3b of the target 3 on the basis of the potential variation in the ignition rod 6 due to contact of the ignition rod 6 with the side surface 3b of the target 3 during movement of the ignition rod 6 from the retraction position S to the transport region T.

Also during film-forming with maintaining arc discharge on the front end surface 3a of the target 3 as described above, the target contact judgment unit 12 judges whether or not the ignition rod 6 has come into contact with the side surface 3b of the target 3 on the basis of the electric potential of the ignition rod 6, through moving the ignition rod 6 from the retraction position S to the transport region T in the rotation direction R intersecting the feed direction Q of the target 3. This makes it possible to judge whether or not the target 3 is present at a predetermined position. This eliminates necessity of interruption of arc discharge for confirming the presence of the target 3, thus making it possible to avoid discontinuity (unevenness) in quality or thickness of a film formed by film-forming by arc discharge. Besides, while arc discharge is occurring between the front end surface 3a of the target 3 and the chamber 2, contact of the ignition rod 6 with the side surface 3b of the target 3 is not likely to shift arc discharge to the ignition rod 6 to damage the ignition rod 6.

(Modification)

Although the detection unit 9 in the above embodiment includes the potential measurement unit 10 which measures an electric potential of the ignition rod 6 and the target contact judgment unit 12 which judges whether or not the ignition rod 6 has come into contact with the side surface 3b of the target 3 based on whether or not the electric potential of the ignition rod 6 is equal to or lower than a predetermined potential, the present invention is not limited thereto. The present invention accepts any detection unit capable of detecting whether or not the contact unit has come into contact with the side surface 3b of the target 3 during movement of the contact unit (the ignition rod 6).

Figure 6:
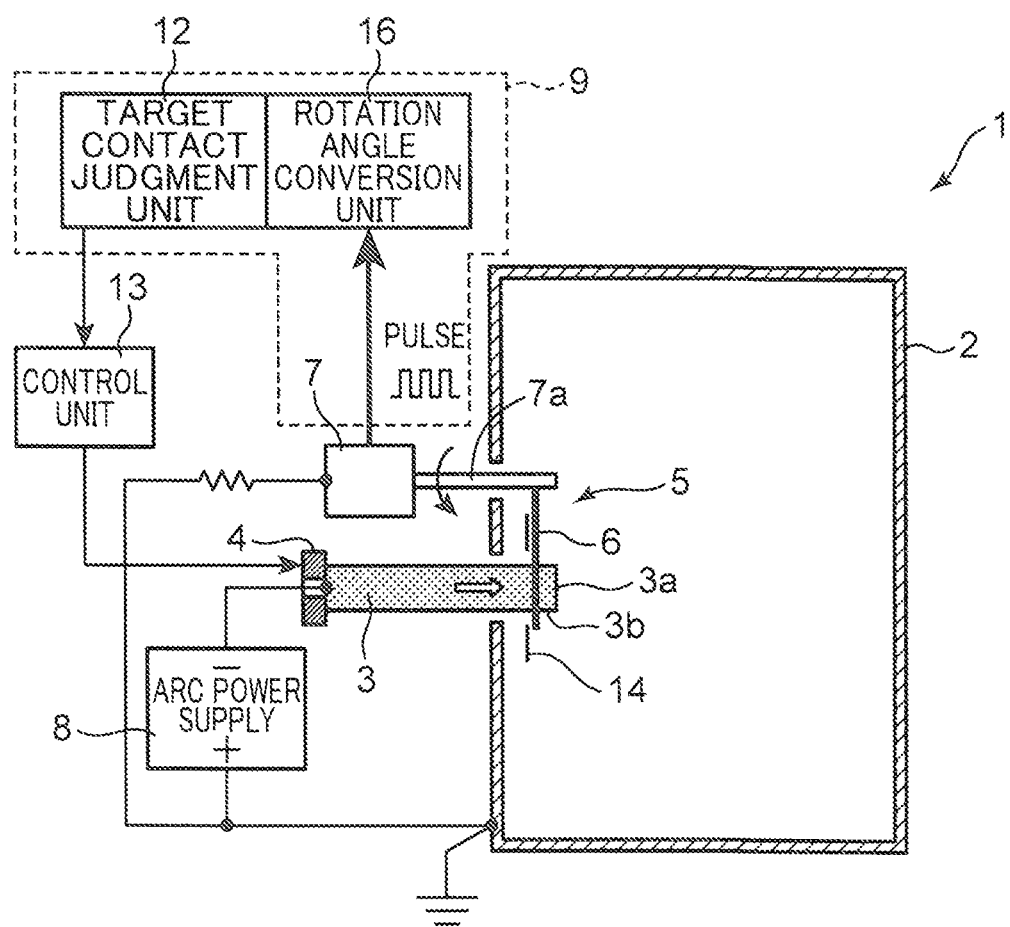
FIG. 6 is a view of an overall configuration of an arc evaporation device according to another embodiment of the present invention, in which whether or not the ignition rod has come into contact with a side surface of a target is detected through the rotation angle of an ignition rod.

For example, FIG. 6 shows an arc evaporation device 1 as a modification of the present invention, in which a detection unit 9 detects whether or not an ignition rod 6 as the contact unit has come into contact with the side surface 3b of the target 3 based on a rotation angle of the ignition rod 6.

Specifically, the detection unit 9 shown in FIG. 6 includes a rotation angle conversion unit 16 serving as an angle measurement unit for detecting a rotation angle of the ignition rod 6, and the target contact judgment unit 12 which judges whether or not the ignition rod has come into contact with the side surface 3b of the target 3 on the basis of the rotation angle.

Similarly to the above embodiment, a rotary actuator 7 rotates the ignition rod 6 by a drive force having a magnitude allowing the driving force to be balanced with a reaction force applied to the ignition rod 6 by the side surface 3b, when the ignition rod 6 has come into contact with the side surface 3b, to thereby make the ignition rod 6 stand still. The rotary actuator 7 in the modification has a pulse generation unit which generates a pulse signal corresponding to a rotation angle of the drive shaft 7a, for example, a rotary encoder.

The rotation angle conversion unit 16 converts the pulse signal generated by the rotary actuator 7 into information on a rotation angle, thereby detecting a rotation angle of the ignition rod 6.

The target contact judgment unit 12 judges whether or not the ignition rod 6 has come into contact with the side surface 3b of the target 3 based on whether or not the rotation angle of the ignition rod 6 measured by the rotation angle conversion unit 16 is equal to or greater than a predetermined angle.

When the ignition rod 6 has come into contact with the side surface 3b of the target 3 while being rotated from the retraction position S to the transport region T (see FIG. 3B) by the rotary actuator 7, the ignition rod 6 stands still at the position; however, when have failed to come into contact with the side surface 3b, the ignition rod 6 passes through the position at which the side surface 3b of the target 3 should be present and therefore rotates beyond a predetermined angle.

By use of the above variation in the rotation angle, the target contact judgment unit 12 in the arc evaporation device 1 shown in FIG. 6 can judge whether or not the ignition rod 6 has come into contact with the side surface 3b of the target 3 based on whether or not the rotation angle of the ignition rod 6 is equal to or greater than a predetermined angle or not. This makes it possible to judge the presence of the target 3 on the basis of the rotation angle of the ignition rod 6 even when no arc discharge occurs or when an arc power supply 8 is not operated.

When the detection unit 9 shown in FIG. 6 detects absence of contact of the ignition rod 6 with the side surface 3b of the target 3 during movement of the ignition rod 6 from the retraction position S to the transport region T, the control unit 13 having received the detection result of absence of contact from the detection unit 9 is allowed to control the target feed unit 4 to move the target 3 in the feed direction Q, similarly to the above embodiment.

Although the above modification shown in FIG. 6 includes the use of the rotation angle conversion unit 16 which converts a pulse signal generated by the rotary actuator 7 into information on a rotation angle, as the angle measurement unit for detecting a rotation angle of the ignition rod 6, the present invention is not limited thereto. The angle measurement unit may have any configuration to detect a rotation angle of a contact unit such as the ignition rod 6.

Figure 7:
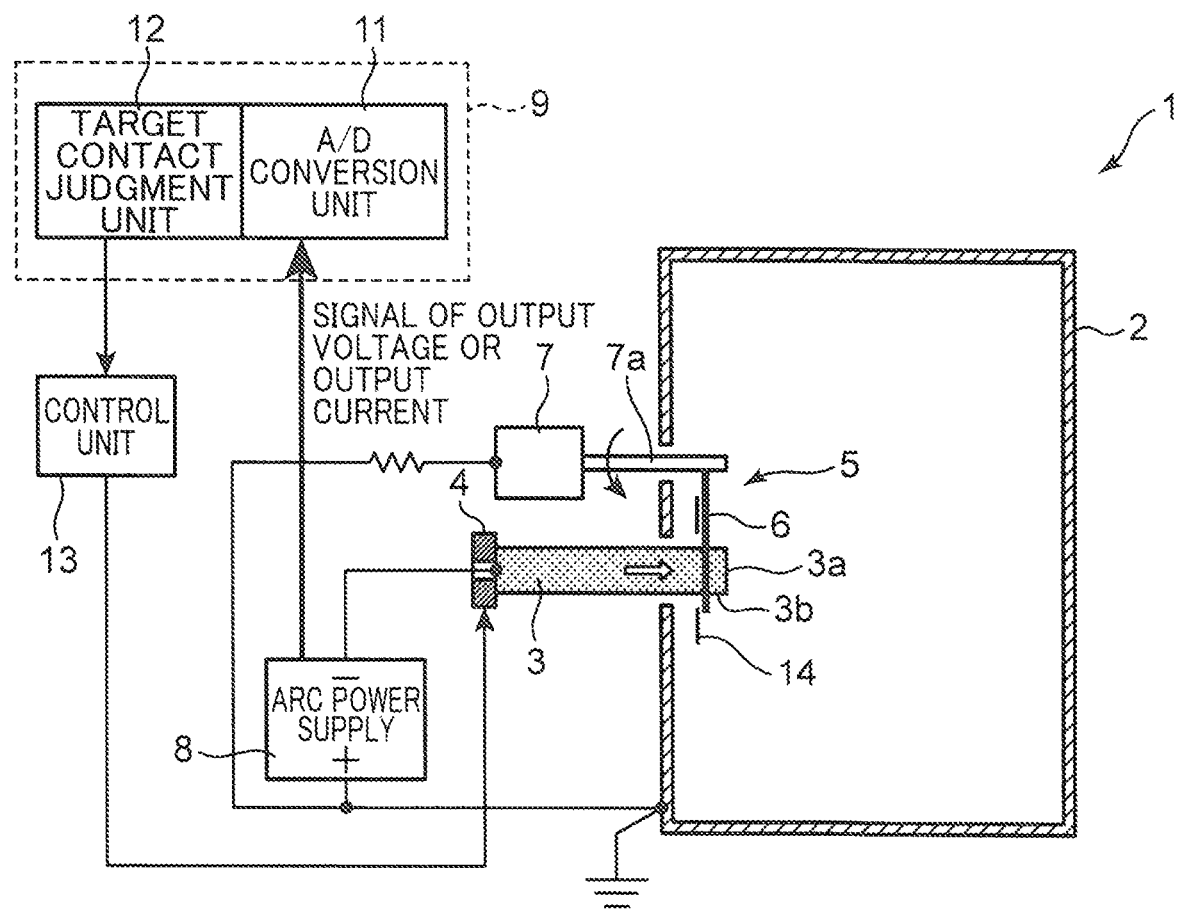
FIG. 7 is a view of an overall configuration of an arc evaporation device according to still another embodiment of the present invention, in which whether or not an ignition rod has come into contact with a side surface of a target is detected through the output current or the output voltage of an arc power supply.

FIG. 7 shows an arc evaporation device 1 as another modification of the present invention, in which a detection unit 9 is configured to check presence/absence of arc discharge on the basis of an output (e. g., an output current or an output voltage) of an arc power supply 8 to detect whether or not the ignition rod has come into contact with the side surface 3b of the target 3.

Specifically, the detection unit 9 has a signal conversion unit 11 which converts a signal of the output current or the output voltage of the arc power supply 8 into a digital signal, and a target contact judgment unit 12 which judges whether or not the ignition rod 6 has come into contact with the side surface 3b of the target 3 on the basis of variation in the output current or the output voltage of the arc power supply 8 during movement of the ignition rod 6 from the retraction position S to the transport region T.

The arc power supply 8 in this modification is configured to periodically stop application of a voltage between the target 3 and the chamber 2 so as to periodically stop arc discharge.

In the arc evaporation device 1 shown in FIG. 7, the arc power supply 8 periodically stops application of a voltage between the target 3 and the chamber 2 to periodically stop arc discharge. Then, in a state where the arc power supply 8 applies a voltage between the target 3 and the chamber 2 and also applies a voltage between the target 3 and the ignition rod 6, the rotary actuator 7 moves the ignition rod 6 from the retraction position S to the transport region T (see FIG. 3B) to cause arc on the target 3 again. On this occasion, the detection unit 9 judges the position of the target 3 based on whether or not arc discharge has started. Specifically, when the ignition rod 6 has moved from the retraction position S to the transport region T to come into contact with the side surface 3b of the target 3 and thereby cause arc discharge to start, the output current or the output voltage of the arc power supply 8 is varied; the target contact judgment unit 12, therefore, can judges whether or not the ignition rod 6 has come into contact with the side surface 3b of the target 3 on the basis of the variation in the output current or the output voltage of the arc power supply 8. Specifically, the target contact judgment unit 12 judges presence of the above contact when the variation in the output current or the output voltage of the arc power supply 8 is equal to or greater than a predetermined value, while judges absence of contact when the variation is smaller than the predetermined value.

This enables the target contact judgment unit 12 to judge the position of the target 3 based on whether or not arc discharge has started. This eliminates the need for an additional circuit or apparatus other than an arc discharge circuit and an arc ignition circuit to determine a position of the target 3.

When the detection unit 9 shown in FIG. 7 detects absence of contact of the ignition rod 6 with the side surface 3b of the target 3 during movement of the ignition rod 6 from the retraction position S to the transport region T, the control unit 13 having received the detection result of absence of contact from the detection unit 9 is allowed to control the target feed unit 4 to move the target 3 in the feed direction Q similarly to the above embodiment.

While the above embodiment has been described with reference to the ignition rod 6 of the ignition mechanism 5 as an example of the contact unit of the present invention, the present invention is not limited thereto. Any contact unit having a shape capable of making contact with the side surface 3b of the target 3 can be used as a contact unit of the present invention. Hence, a member other than the ignition rod 6 of the ignition mechanism 5 can be used as the contact unit, configured to come into contact with the side surface 3b of the target 3 to detect the target 3.

The shape of the contact unit is not limited to a bar-shape in the present invention; any shape capable of making contact with the side surface 3b of the target 3 can be adopted.

While the above embodiment includes the use of the rotary actuator 7 which applies a rotation drive force to the ignition rod 6 as the contact-unit driving unit of the present invention, the present invention is not limited thereto. Any unit that moves the contact unit (the ignition rod 6) from a retraction position along a direction intersecting the feed direction Q to make the contact unit enter the transport region T (i.e., FIG. 3B) to which the target 3 is fed can be used as the contact-unit driving unit of the present invention. Hence, the contact-unit driving unit of the present invention may be one configured to move the contact unit linearly from the retraction position to the transport region T along a direction intersecting the feed direction Q. For example, the contact-unit driving unit may move a bar-shaped contact unit linearly in a direction in which a side surface of the contact unit can come into contact with the side surface 3b of the target 3, or may move a bar-shaped contact unit may linearly in the axial direction of the contact unit so as to bring the tip end of the bar-shaped contact unit into contact with the side surface 3b of the target 3. The direction intersecting the feed direction Q is not limited to a direction orthogonal to the feed direction Q but permitted to be a direction intersecting the feed direction Q at an angle other than 90°.

While the shield plate 14 and the ring-shaped magnet 15 in the above embodiment are disposed in the chamber 2 to prevent arc discharge from occurring on the side surface 3b to make arc discharge occur only on the front end surface 3a of the target 3, the present invention is not limited thereto. As a modification of the present invention for making arc discharge occur only on the front end surface 3a of the target 3, the arc evaporation device may be provided with, for example, an insulation ring which covers the side surface of the target 3 at a position near the front end surface 3a of the target 3. The insulation ring is a ring-shaped member made of an insulation material having poor conductivity. According to this configuration, the insulation ring insulating the side surface of the target 3 from the chamber 2 can prevent arc discharge from occurring on the side surface to thereby make arc discharge occur only on the front end surface 3a.

Figure 8:
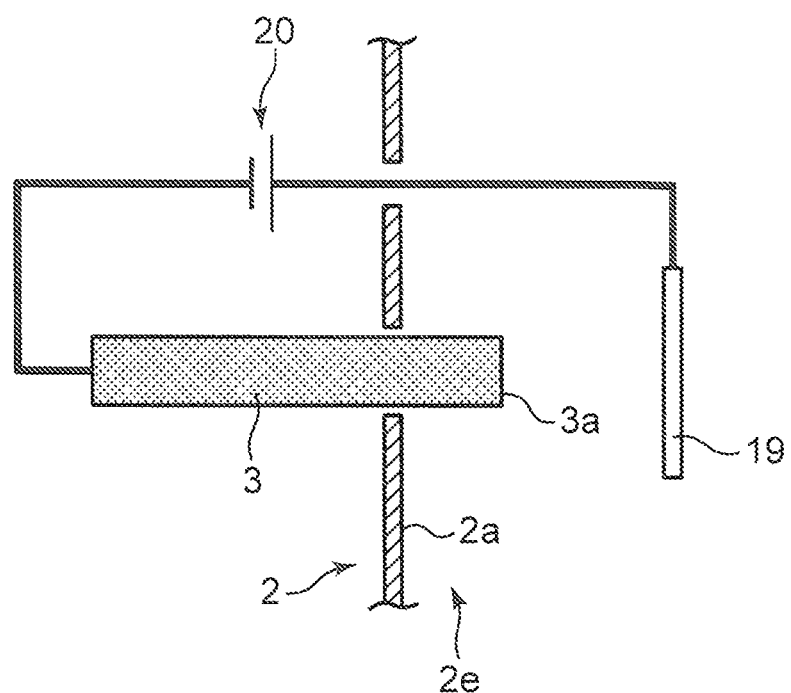
FIG. 8 is a view for explaining an example in which an anode insulated from a chamber is arranged at a position opposed to the front end surface of the target in FIG. 1 in order to allow arc discharge to be generated only on the front end surface of the target as another modification of the present invention.

As a further modification of the present invention, there may be encompassed an embodiment including, as shown in FIG. 8, an anode 19 insulated from the chamber 2 is disposed at a position opposed to the front end surface 3a of the target 3, an arc power supply 20 having a positive electrode connected to the anode 19 and a negative electrode connected to a target 3. In this embodiment, arc discharge locally occurs only between the front end surface 3a and the anode 19 opposed thereto, preventing arc discharge from occurring on the side surface of the target 3.

The above-described specific embodiments mainly include the invention having the following configurations.

The arc evaporation device according to the present embodiment includes: a bar-shaped target which has a front end surface as one end surface in an axial direction and a side surface extending in the axial direction, the side surface being continuous with a peripheral edge of the front end surface, the target being configured to be melted and evaporated from the front end surface thereof by arc discharge; an electrode for discharging between the electrode and the front end surface of the target; an arc power supply which applies a voltage between the target and the electrode to cause arc discharge between the front end surface and the electrode; a target feed unit which moves the target in a feed direction in which the front end surface advances and along the axial direction; a contact unit having a shape capable of making contact with the side surface of the target, at a predetermined position with respect to the feed direction, in an intersecting direction intersecting the feed direction; a contact-unit driving unit which moves the contact unit along the intersecting direction from a retraction position apart from the side surface in the intersecting direction, so as to make the contact unit enter a transport region into which the target is fed; and a detection unit which detects whether or not the contact unit has come into contact with the side surface of the target during movement of the contact unit.

According to this configuration, it is possible to detect whether or not the contact unit has come into contact with the side surface of target during movement of the contact unit from the retraction position to the transport region into which the target is fed, in order to confirm the presence of the target being evaporated from the front end surface thereof by arc discharge. According to this configuration, even when the contact unit repeats contact with the target for detecting the target to deform itself in the intersecting direction intersecting the feed direction of the target, the detection unit can detect whether or not the contact unit has come into contact with the side surface of the target at a predetermined position in the target feed direction while the contact unit is moving along the intersecting direction from the retraction position toward the transport region into which the target is fed. By use of this detection result, can be judged whether or not the target is present at a predetermined position in the feed direction of the target (i.e., whether or not the front end of the target protrudes frontward of the contact unit in the feed direction beyond the contact unit). This makes it possible to precisely detect, for a long period of time, whether or not the target is present at a predetermined position.

The contact unit preferably has conductivity to start arc discharge between the front end surface and the electrode by contact of the contact unit with the side surface of the target in a state where a voltage is applied between the contact unit and the target.

According to this configuration, the contact unit can cause arc on the target by coming into contact with the side surface of the target in a state where the arc power supply applies a voltage between the target and the electrode and a voltage is applied between the contact unit and the target, thereby starting arc discharge between the front end surface of the target and the electrode.

The detection unit preferably has a potential measurement unit which measures an electric potential of the contact unit, and a judgment unit which judges whether or not the contact unit has come into contact with the side surface of the target based on the electric potential of the contact unit measured by the potential measurement during movement of the contact unit.

When the contact unit is brought into contact with the side surface of the target in a state where a voltage is applied between the target and the contact unit to cause arc on the target, current passes between the contact unit and the target, which causes reduction in an electric potential of the contact unit. By use of the potential difference, the judgment unit can judge whether or not the contact unit has come into contact with the side surface of the target on the basis of the potential variation in the contact unit caused by the contact of the contact unit with the side surface of the target during movement of the contact unit from the retraction position to the transport region.

In addition, even during film-forming with maintaining arc discharge on the front end surface of the target, the judgment unit can judge whether or not the contact unit has come into contact with the side surface of the target on the basis of the electric potential of the contact unit, by moving the contact unit from the retraction position to the transport region in the intersecting direction intersecting the feed direction of the target, to thereby judge whether or not the target is at a predetermined position. This eliminates necessity for interrupting arc discharge to confirm presence of a target, which makes it possible to avoid discontinuity (unevenness) in quality or thickness of a film formed by film-forming by arc discharge. While arc discharge is occurring between the front end surface of the target and the chamber, the contact of the contact unit with the side surface of the target is not likely to shift arc discharge to the contact unit to damage the contact unit.

The detection unit may preferably have a judgment unit which judges whether or not the contact unit has come into contact with the side surface of the target on the basis of an output change of the arc power supply during movement of the contact unit from the retraction position to the transport region.

This configuration makes it possible to judge a target position by periodical stopping application of a voltage between the target and the electrode by the arc power supply to periodically stop arc discharge, moving the contact unit from the retraction position to the transport region to conduct operation of causing arc on the target again, and judging whether or not arc discharge has started. Specifically, since an output (voltage or current) of the arc power supply varies when the contact unit has moved from the retraction position to the transport region to come into contact with the side surface of the target and thereby start arc discharge, the judgment unit can judge whether or not the contact unit has come into contact with the side surface of the target on the basis of the variation in the output of the arc power supply. In other words, the judgment unit can judge the target position based on whether or not arc discharge has started. This eliminates the need for an additional circuit or apparatus other than an arc discharge circuit and an arc ignition circuit for determining a position of the target.

It is preferable that the arc evaporation device further includes a chamber which houses the contact unit and a portion of the target, the portion including the front end surface of the target, the chamber having conductivity to allow the chamber to function as the electrode, the chamber including a main wall having a through hole into which the target can be inserted, and that the contact unit enters the transport region from the retraction position along the intersecting direction, at a position apart from the main wall inside the chamber by such a distance as to prevent arc discharge between the main wall and the side surface of the target.

According to this configuration, since the contact unit comes into contact with the side surface of the target at a position apart from the main wall of the chamber by such a distance as to prevent arc discharge between the main wall and the side surface of the target, abnormal discharge can be prevented such as arc discharge generated between the side surface of the target and the main wall, even when arc discharge is occurring between the front end surface of the target and a part of the chamber other than the main wall (e.g., a top plate, a bottom plate, or the like).

The contact-unit driving unit is preferably configured to rotate the contact unit around a center axis extending in parallel to the axial direction, the center axis being apart from the side surface of the target in the intersecting direction, to thereby rotate the contact unit so as to make the contact unit enter the transport region from the retraction position along the intersecting direction.

According to this configuration, the contact-unit driving unit can move the contact unit from the retraction position so as to make the contact unit enter the transport region along the intersecting direction in a simple configuration for rotating the contact unit.

It is possible that the contact-unit driving unit is configured to rotate the contact unit by a drive force having a magnitude allowing the driving force to be balanced with a reaction force applied to the contact unit by the side surface when the contact unit comes into contact with the side surface to make the contact unit stand still, and that the detection unit has an angle measurement unit which detects a rotation angle of the contact unit and a judgment unit which judges whether or not the contact unit has come into contact with the side surface of the target based on whether or not the rotation angle of the contact unit measured by the angle measurement unit is equal to or greater than a predetermined angle.

In this configuration, when the contact unit has come into contact with the side surface of the target while being rotated from the retraction position to the transport region by the contact-unit driving unit, the contact unit stands still at the position; however, when having failed to come into contact with the side surface, the contact unit passes through the position at which the side surface of the target should be present and rotates beyond a predetermined angle. This enables the judgment unit to judge whether or not the contact unit has come into contact with the side surface of the target based on whether the rotation angle of the contact unit is equal to or greater than the predetermined angle by use of the above variation in the rotation angle. The configuration thus makes it possible to judge presence of the target on the basis of the rotation angle of the contact unit even when no arc discharge occurs or when the arc power supply is not in operation.

The arc evaporation device preferably further includes a control unit which controls the target feed unit to move the target in the feed direction in which the front end surface advances and along the axial direction when the detection unit detects absence of contact of the contact unit with the side surface of the target during movement of the contact unit from the retraction position to the transport region.

According to this configuration, when the contact unit has failed to come into contact with the side surface of the target during movement of the contact unit from the retraction position to the transport region, the control unit controls the target feed unit to advance the target in the feed direction in which the front end surface advances and along the axial direction, which enables the target to be automatically fed. As a result, when consumption of the target during film-forming work brings the front end surface of the target to a position retracted from the contact unit, the target can be automatically fed without interrupting the film-forming work.

The invention claimed is:

1. An arc evaporation device comprising:
a bar-shaped target which has a front end surface as one end surface in an axial direction and a side surface extending in the axial direction, the side surface being continuous with a peripheral edge of the front end surface, the target being configured to be melted and evaporated from the front end surface thereof by arc discharge;
an electrode for discharging between the electrode and the front end surface of the target;
an arc power supply which applies a voltage between the target and the electrode to cause arc discharge between the front end surface and the electrode;
a target feed unit which moves the target in a feed direction in which the front end surface advances and along the axial direction;
a contact unit having a shape capable of making contact with the side surface of the target, at a predetermined position with respect to the feed direction, in an intersecting direction intersecting the feed direction;
a contact-unit driving unit which moves the contact unit along the intersecting direction from a retraction position apart from the side surface in the intersecting direction, so as to make the contact unit enter a transport region into which the target is fed; and
a detection unit which detects whether or not the contact unit has come into contact with the side surface of the target during movement of the contact unit to enter the transport region from the retraction position, wherein
the contact unit is configured with a bar-shaped conductive ignition rod to start arc discharge between the front end surface and the electrode by contact of the contact unit with the side surface of the target in a state where a voltage is applied between the contact unit and the target,
the contact-unit driving unit has a drive shaft which rotates around the center axis extending in parallel with the axial direction, the drive shaft being apart from the side surface of the target in the intersecting direction, the contact unit is fixed to the drive shaft so as to protrude beyond a circumferential surface of the drive shaft in a direction orthogonal to the axial direction of the drive shaft, and rotating the contact unit by the rotation of the drive shaft, the contact-unit driving unit can move the contact unit so as to make the contact unit enter the transport region from the retraction position along the intersecting direction.

2. The arc evaporation device according to claim 1, wherein the detection unit includes a potential measurement unit which measures an electric potential of the contact unit, and a judgment unit which judges whether or not the contact unit has come into contact with the side surface of the target based on the electric potential of the contact unit measured by the potential measurement unit during movement of the contact unit.

3. The arc evaporation device according to claim 1, wherein the detection unit includes a judgment unit which judges whether or not the contact unit has come into contact with the side surface of the target on the basis of an output change of the arc power supply during movement of the contact unit from the retraction position to the transport region.

4. The arc evaporation device according to claim 1, wherein the contact-unit driving unit rotates the contact unit by a drive force having a magnitude allowing the driving force to be balanced with a reaction force applied to the contact unit by the side surface when the contact unit comes into contact with the side surface to make the contact unit stand still, and the detection unit includes an angle measurement unit which detects a rotation angle of the contact unit and a judgment unit which judges whether or not the contact unit has come into contact with the side surface of the target based on whether or not the rotation angle of the contact unit measured by the angle measurement unit is equal to or greater than a predetermined angle.

5. The arc evaporation device according to claim 1, wherein the detection unit further includes a control unit which controls the target feed unit to move the target in the feed direction in which the front end surface advances and along the axial direction when the detection unit detects absence of contact of the contact unit with the side surface of the target during movement of the contact unit from the retraction position to the transport region.

6. The arc evaporation device according to claim 1, further comprising:

a shield plate including a through hole through which the target feed unit moves the target in the feed direction, the shield plate being insulated from the electrode and covering the peripheral edge of the front end surface of the target to prevent discharging between the electrode and the side surface of the target.

7. The arc evaporation device according to claim 1, further comprising:

at least one magnet enclosing the side surface of the target, the at least one magnet generating a magnetic field that prevents discharging between the electrode and the side surface of the target.

8. The arc evaporation device according to claim 1, further comprising:

an insulator enclosing the side surface of the target, the insulator insulating the side surface of the target from the electrode to prevent discharging between the electrode and the side surface of the target.

9. The arc evaporation device according to claim 1, wherein the predetermined position at which the contact unit makes contact with the side surface of the target is spaced apart from the electrode by a distance that prevents discharging between the electrode and the side surface of the target.

* * * * *